US009846190B2

(12) United States Patent
Tateda et al.

(10) Patent No.: US 9,846,190 B2
(45) Date of Patent: Dec. 19, 2017

(54) MOTOR DRIVE DEVICE INCLUDING FUNCTION TO DETECT FAILURE IN INSULATION RESISTANCE DETERIORATION DETECTION UNIT OF MOTOR, AND FAILURE DETECTION METHOD

(71) Applicant: FANUC CORPORATION, Yamanashi (JP)

(72) Inventors: Masaya Tateda, Yamanashi (JP); Hiroyasu Sato, Yamanashi (JP); Akira Hirai, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 14/685,672

(22) Filed: Apr. 14, 2015

(65) Prior Publication Data

US 2015/0293165 A1 Oct. 15, 2015

(30) Foreign Application Priority Data

Apr. 15, 2014 (JP) .................................. 2014-083583

(51) Int. Cl.
*H01L 41/43* (2013.01)
*G01R 31/14* (2006.01)
(Continued)

(52) U.S. Cl.
CPC ........... *G01R 31/025* (2013.01); *G01R 35/00* (2013.01); *H02H 11/005* (2013.01); *H02P 29/0241* (2016.02); *G01R 31/42* (2013.01)

(58) Field of Classification Search
CPC ......... H02K 1/278; H02K 1/22; H02K 12/045
See application file for complete search history.

(56) References Cited

U.S. PATENT DOCUMENTS 8,115,428 B2* 2/2012 Williams ............. B62D 5/0481
318/400.02
2006/0158197 A1* 7/2006 Horikoshi ............ G01R 31/343
324/551
(Continued)

FOREIGN PATENT DOCUMENTS

CN 1819412 A 8/2006
CN 102263539 A 11/2011
(Continued)

OTHER PUBLICATIONS

English Abstract and machine translation for Japanese Publication No. 2006-226993, published Aug. 31, 2006, 27 pgs.
(Continued)

*Primary Examiner* — Eduardo Colon Santana
*Assistant Examiner* — Charles S Laughlin
(74) *Attorney, Agent, or Firm* — Fredrikson & Byron, P.A.

(57) ABSTRACT

A motor drive device includes a power source unit rectifying AC voltage to DC voltage and to smooth the DC voltage by a capacitor, a motor drive amplification, a power source voltage measurement unit, an insulation resistance deterioration detection unit having a contact unit connecting one end of the capacitor to the ground and a current detection unit provided between the other end of the capacitor and a motor coil, and detecting a deterioration in an insulation resistance of the motor based on a detected signal obtained from a closed circuit formed by the contact unit, the capacitor, the motor coil, and the ground by using the current detection unit, and a failure detection unit detecting a failure in the insulation resistance deterioration detection unit based on the detected signal in the insulation resistance deterioration detection unit and a voltage value measured by the power source voltage measurement unit.

6 Claims, 12 Drawing Sheets

(51) Int. Cl.
*G01R 31/02* (2006.01)
*G01R 35/00* (2006.01)
*H02H 11/00* (2006.01)
*H02P 29/024* (2016.01)
*G01R 31/42* (2006.01)

(56) References Cited

U.S. PATENT DOCUMENTS

| | | | |
|---|---|---|---|
| 2008/0150549 A1* | 6/2008 | Horikoshi | G01R 31/343 324/557 |
| 2009/0195205 A1* | 8/2009 | Ide | G01R 31/1227 318/490 |
| 2011/0292696 A1 | 12/2011 | Xiao et al. | |

FOREIGN PATENT DOCUMENTS

| | | |
|---|---|---|
| DE | 602006000132 T2 | 7/2008 |
| JP | 2001141795 A | 5/2001 |
| JP | 2006226993 A | 8/2006 |
| JP | 2008058088 A | 3/2008 |
| JP | 2008157672 A | 7/2008 |
| JP | 2009204600 A | 9/2009 |

OTHER PUBLICATIONS

English Translation of Abstract for Japanese Publication No. 2009204600, published Sep. 10, 2009, 1 page.
English Translation of Abstract for Japanese Publication No. 2008157672, published Jul. 10, 2008, 1 page.
English Translation of Abstract for Japanese Publication No. 2008058088, published Mar. 13, 2008, 1 page.
English Translation of Abstract for Japanese Publication No. 2001141795, published May 25, 2001, 1 page.
English Abstract for Chinese Publication No. 102263539 A, Nov. 30, published 2011, 1 pg.
English Abstract for Chinese Publication No. 1819412 A, published Aug. 16, 2006, 2 pgs.
Translated Decision to Grant a Patent for JP2014-083583, dated Oct. 6, 2015, 3 pages.
Untranslated Decision to Grant a Patent for JP2014-083583, dated Oct. 6, 2015, 3 pages.
Translated Notification of Reasons for Refusal for JP2014-083583, dated Jul. 28, 2015, 2 pages.
Untranslated Notification of Reasons for Refusal for JP2014-083583, dated Jul. 28, 2015, 2 pages.
English Abstract for German Publication No. 60 2006 000 132 T2, published Jul. 10, 2008, 1 pg.

* cited by examiner

MOTOR DRIVE DEVICE INCLUDING FUNCTION TO DETECT FAILURE IN INSULATION RESISTANCE DETERIORATION DETECTION UNIT OF MOTOR, AND FAILURE DETECTION METHOD

CROSS-REFERENCE TO RELATED APPLICATIONS

This application is a new U.S. patent application that claims benefit of JP 2014-083583, filed on Apr. 15, 2014, the entire content of JP 2014-083583 is hereby incorporated by reference.

FIELD OF THE INVENTION

The present invention relates to a motor drive device including a function for detecting a failure in an insulation resistance deterioration detection unit of a motor, and a failure detection method, and in particular, to a device that detects deterioration in the insulation resistance of a motor connected to a motor drive device capable of driving a motor, and a failure detection method of the device.

BACKGROUND OF THE INVENTION

In the case where a motor is driven by a motor drive device, if the insulation resistance of the coil (winding) of the motor is abnormally low, it is no longer possible to drive the motor normally. Because of this, a method for measuring the insulation resistance of a motor coil has been reported (for example, JP 2006-226993A, hereinafter referred to as "Patent Literature 1"). Patent Literature 1 describes a device that detects deterioration in the insulation resistance of a winding of a motor that is connected to a motor drive device including a power source unit configured to convert a three-phase alternating-current (AC) power source to a direct-current (DC) power source by rectifying the three-phase alternating current and smoothing the current by a smoothing capacitor, and a motor drive amplifier that drives a motor by converting the DC power source to an AC power source whose frequency can be varied.

In other words, when detecting deterioration in insulation resistance, the three-phase AC power source is cut off, one end of the smoothing capacitor is grounded, the other end is connected to the motor coil, and the current that flows through the insulation resistance of the motor is compared with a reference value, thereby, deterioration in insulation resistance is detected.

However, in order to accurately measure the insulation resistance of a motor, it is necessary to accurately measure the current that flows through the insulation resistance of the motor. If a failure occurs in the insulation resistance deterioration detection unit of the motor, an error occurs in the results of the measurement of the insulation resistance of the motor, therefore it is not possible to detect the error.

An object of the present invention is to "implement" a motor drive device that "detects a failure in an insulation resistance deterioration detection unit of a motor", which has been the problem in the conventional technique, "without adding a dedicated detection circuit and increasing any unnecessary costs".

SUMMARY OF THE INVENTION

The motor drive device including a function to detect a failure in an insulation resistance deterioration detection unit of a motor according to one embodiment of the present invention includes: a power source unit configured to rectify an AC voltage supplied from an AC power source via a switch to a DC voltage in a rectification circuit and to smooth the rectified DC voltage by a capacitor; a motor drive amplification unit configured to drive a motor by converting the DC voltage from the power source unit to an AC voltage by using upper-arm and lower-arm switching elements; a power source voltage measurement unit configured to measure the voltage of the power source unit; an insulation resistance deterioration detection unit having a contact unit that connects one end of the capacitor to the ground and a current detection unit provided between the other end of the capacitor and a motor coil, and configured to detect the presence/absence of a deterioration in the insulation resistance of the motor based on a detected signal that is obtained from a closed circuit formed by the contact unit, the capacitor, the motor coil, and the ground by using the current detection unit after bringing the switch to the off state and the contact unit to the on state; and a failure detection unit configured to detect the presence/absence of a failure in the insulation resistance deterioration detection unit based on the detected signal in the insulation resistance deterioration detection unit and the voltage value measured by the power source voltage measurement unit by changing the contact unit from the on state to the off state and causing the upper-arm or lower-arm switching elements of the motor drive amplification unit to perform switching arbitrarily.

The failure detection method of an insulation resistance deterioration detection unit of a motor according to another embodiment of the present invention is a failure detection method of an insulation resistance deterioration detection unit of a motor in a motor drive device including a power source unit configured to rectify power supplied from an AC power source, via a switch in a rectification circuit and to smooth the power by a capacitor, and a motor drive amplification unit configured to drive the motor by converting the DC voltage from the power source unit to an AC voltage, the failure detection method including the steps of: measuring a voltage of the power source unit; detecting the presence/absence of a deterioration in the insulation resistance of the motor based on a detected signal that is obtained from a closed circuit formed by a contact unit, a capacitor, a motor coil, and the ground by connecting the contact unit at one end of the capacitor to the ground and, at the same time, connecting the other end to the motor coil after the insulation resistance deterioration detection unit brings the switch to the off state and stops the operation of the motor; changing the contact unit from the on state to the off state; causing upper-arm or lower-arm switching elements of a motor drive amplification unit to perform switching arbitrarily; and detecting a failure in the insulation resistance deterioration detection unit based on the detected signal measured in the step for detecting the presence/absence of the deterioration in the insulation resistance and a voltage value measured by the power source unit.

DESCRIPTION OF THE DRAWINGS

These and other features and advantages of the present invention will be better understood by reading the following detailed description, taken together with the drawings wherein.

DETAILED DESCRIPTION OF THE PREFERRED EMBODIMENT

Hereinafter, with reference to the drawings, a motor drive device including a function to detect a failure in an insulation resistance deterioration detection unit of a motor, and a failure detection method according to the present invention are explained. However, it should be noted that the technical scope of the present invention is not limited to embodiments below and encompasses the inventions described in the claims and equivalents thereof.

First Embodiment

Figure 1:
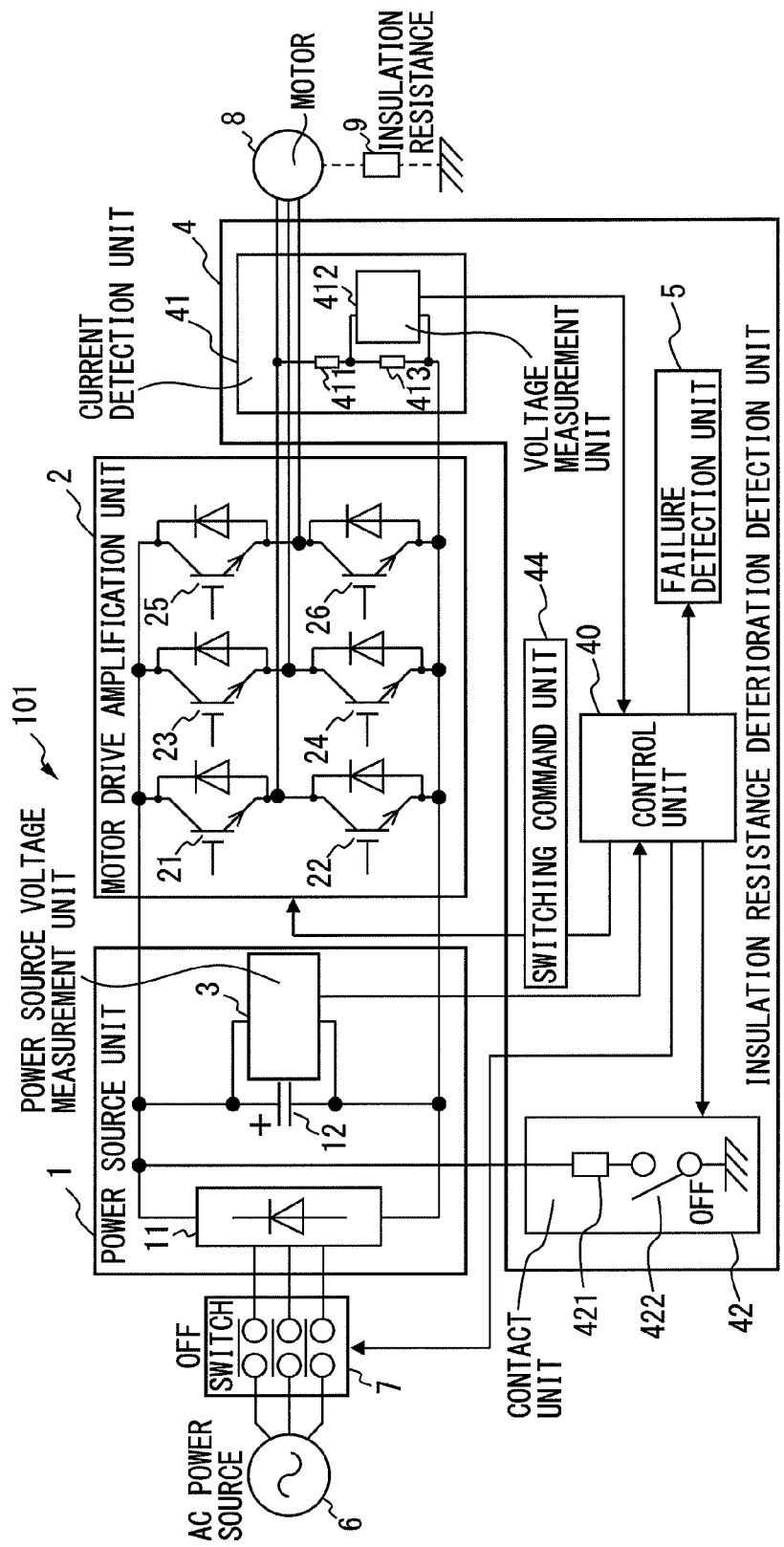
FIG. 1 is a block diagram of a motor drive device according to a first embodiment of the present invention.

First, a motor drive device according to a first embodiment of the present invention is explained. FIG. 1 illustrates a block diagram of a motor drive device 101 according to the first embodiment of the present invention. The motor drive device 101 according to the first embodiment of the present invention includes: a power source unit 1 configured to rectify an AC voltage supplied from an AC power source 6 via a switch 7 to a DC voltage in a rectification circuit 11 and to smooth the rectified DC voltage by a capacitor 12; a motor drive amplification unit 2 configured to drive a motor 8 by converting a DC voltage from the power source unit 1 to an AC voltage by using upper-arm and lower-arm switching elements 21 to 26; a power source voltage measurement unit 3 configured to measure the voltage of the power source unit 1; an insulation resistance deterioration detection unit 4 having a contact unit 42 configured to connect one end of the capacitor 12 to the ground and a current detection unit 41 provided between the other end of the capacitor 12 and a motor coil, and configured to detect the presence/absence of a deterioration in insulation resistance 9 of the motor 8 based on a detected signal that is obtained from a closed circuit formed by the contact unit 42, the capacitor 12, the motor coil, and the ground by using the current detection circuit 41 after bringing the switch 7 to the off state and the contact unit 42 to the on state; and a failure detection unit 5 configured to detect the presence/absence of a failure in the insulation resistance deterioration detection unit 4 based on the detected signal in the insulation resistance deterioration detection unit 4 and the voltage value measured by the power source voltage measurement unit 3 by changing the contact unit 42 from the on state to the off state and causing the upper-arm switching elements 21, 23, and 25 or the lower-arm switching elements 22, 24, and 26 of the motor drive amplification unit 2 to perform switching arbitrarily.

In particular, in the present embodiment, in the above-described motor drive device, a resistance 413 for detecting a current is provided in the closed circuit in the insulation resistance deterioration detection unit 4, the detected signal is a difference between potentials that are produced on both ends of the resistance 413, and the presence/absence of a deterioration in the insulation resistance of the motor is detected by detecting a current from the potential difference and the resistance.

The motor drive device 101 according to the first embodiment illustrated in FIG. 1 is explained in more detail. A three-phase AC voltage supplied from the AC power source 6 is input to the power source unit 1 via the switch 7. The power source unit 1 includes the rectification circuit 11 and the smoothing capacitor (hereinafter, simply referred to also as "capacitor") 12, and the AC voltage supplied from the AC power source 6 is rectified to a DC voltage in the rectification circuit 11, and the rectified DC voltage is further smoothed by the smoothing capacitor 12. The turning on/off of the switch 7 is controlled by a control unit 40 provided in the insulation resistance deterioration detection unit 4.

Further, the power source voltage measurement unit 3 is provided across both the terminals of the smoothing capacitor 12 and it is possible to measure the voltage that is applied, to the smoothing capacitor 12.

The DC voltage smoothed by the smoothing capacitor 12 is input to the motor drive amplification unit 2. In the motor drive amplification unit 2, the six power semiconductor switching elements 21 to 26 and diodes arranged in inversely parallel thereto are provided. The six power semiconductor switching elements 21 to 26 are divided to the upper-arm switching elements 21, 23, and 25 and the lower-arm switching elements 22, 24, and 26. By causing the six power semiconductor switching elements 21 to 26 to perform switching in accordance with a command from a switching command unit 44 that is provided in the insulation resistance deterioration detection unit 4, it is possible to drive the motor 8 by outputting an AC voltage of a desired frequency.

In the motor drive device 101 according to the first embodiment of the present invention, the insulation resistance deterioration detection unit 4 is provided and it is possible to detect the presence/absence of deterioration in the insulation resistance of the motor by measuring the insulation resistance 9 of the motor coil (not illustrated). The insulation resistance deterioration detection unit 4 includes the control unit 40, the current detection unit 41, the contact unit 42, and the switching command unit 44.

The current detection unit 41 is provided between the other end of the smoothing capacitor 12 and the motor coil and includes a voltage dividing resistance 411, the detection resistance 413, and a voltage measurement unit 412 configured to measure a voltage that is applied across both ends of the detection resistance 413. The current detection unit 41 detects a current that flows through the closed circuit formed by the contact unit 42, the smoothing capacitor 12, the motor coil, and the ground based on the voltage value, which is the detected signal of the voltage measurement unit 412, and the resistance.

The contact unit 42 includes a resistance 421 and a switch 422, and one end of the resistance 421 is connected to the plus side terminal, which is one end of the smoothing capacitor 12, and one end of the switch 422 is connected to the ground. Consequently, by turning on the switch 422, the plus side terminal, which is one end of the smoothing capacitor 12, is connected to the ground.

Figure 2:
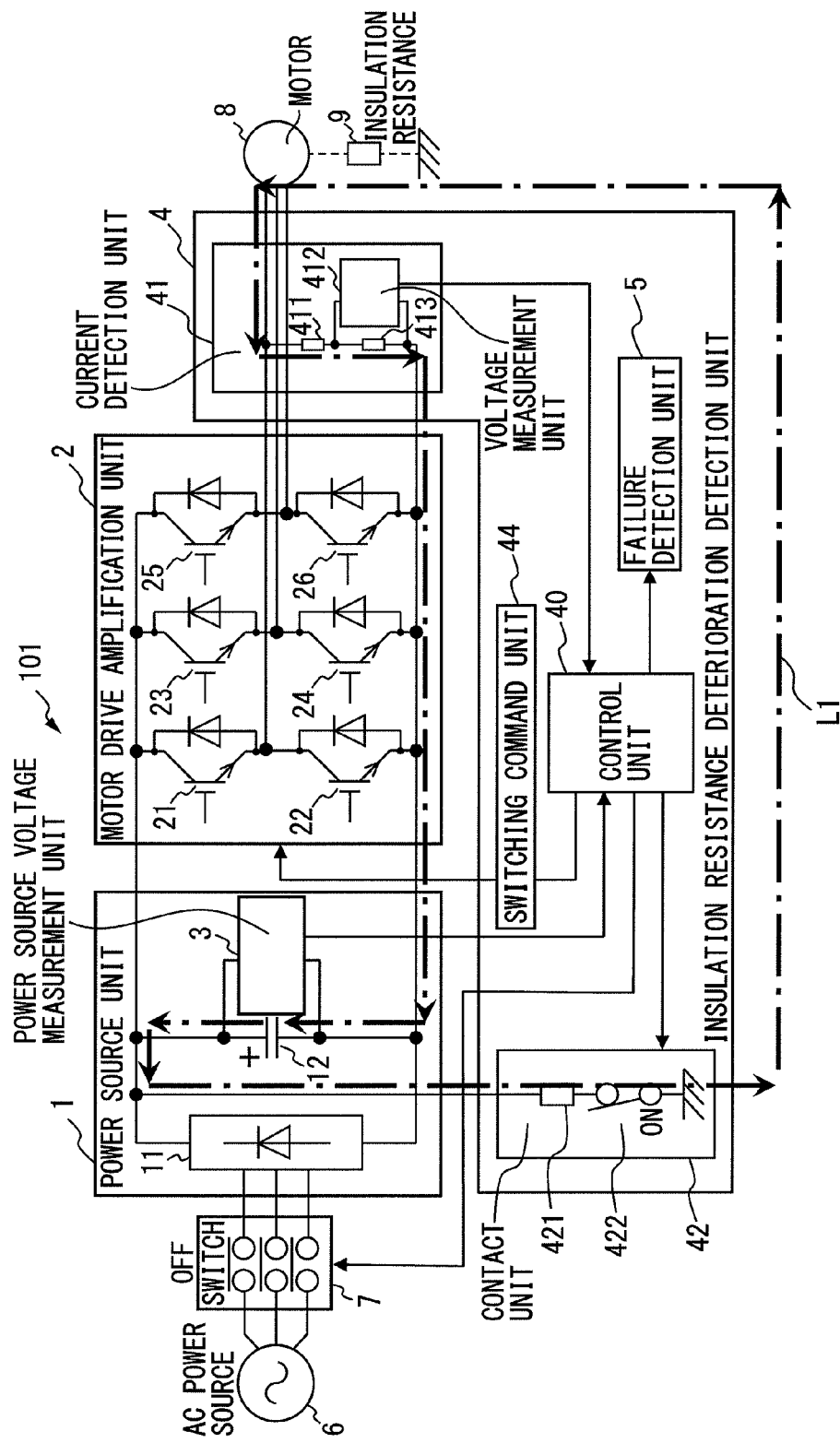
FIG. 2 is a diagram illustrating a path of a current that flows in the case where the insulation resistance of a motor is measured in the motor drive device according to the first embodiment of the present invention.

Next, a detection method of insulation resistance of a motor by using the motor drive device 101 according to the first embodiment of the present invention is explained. In FIG. 2, the path of the current that flows in the case where the insulation resistance of the motor is measured in the motor drive device according to the first embodiment of the present invention is indicated by a chain line L1. As illustrated in FIG. 2, based on a command from the control unit 40, the switch 7 is brought to the off state, the switch 422 of the contact unit 42 is brought to the on state, and the switching elements 21 to 26 of the motor drive amplification unit 2 are brought to the off state. At this time, through the closed circuit formed by the contact unit 42, the smoothing capacitor 12, the motor coil, and the ground, the current flows as indicated by the chain line L1 in FIG. 2. By measuring the current by using the current detection unit 41, it is possible to detect the insulation resistance of the motor. Specifically, by dividing the voltage of the power source unit 1, which is obtained by rectifying the AC voltage from the AC power source 6, by the measured current, the resistance value of the entire pathway through which the current flows is obtained. By subtracting the resistance value within the circuit used in the design from the obtained resistance value, it is possible to calculate the insulation resistance. However, if a failure (abnormality in the resistance value within the circuit or in the measured value of the voltage) occurs in the insulation resistance deterioration detection unit (within the route indicated by the arrow-attached chain L1), the calculated value of the insulation resistance value also becomes abnormal, and it is no longer possible to calculate an accurate value of the insulation resistance. Because of this, the motor drive device according to the first embodiment of the present invention includes the failure detection unit 5 configured to detect the presence/absence of a failure in the insulation resistance deterioration detection unit 4.

Figure 3:
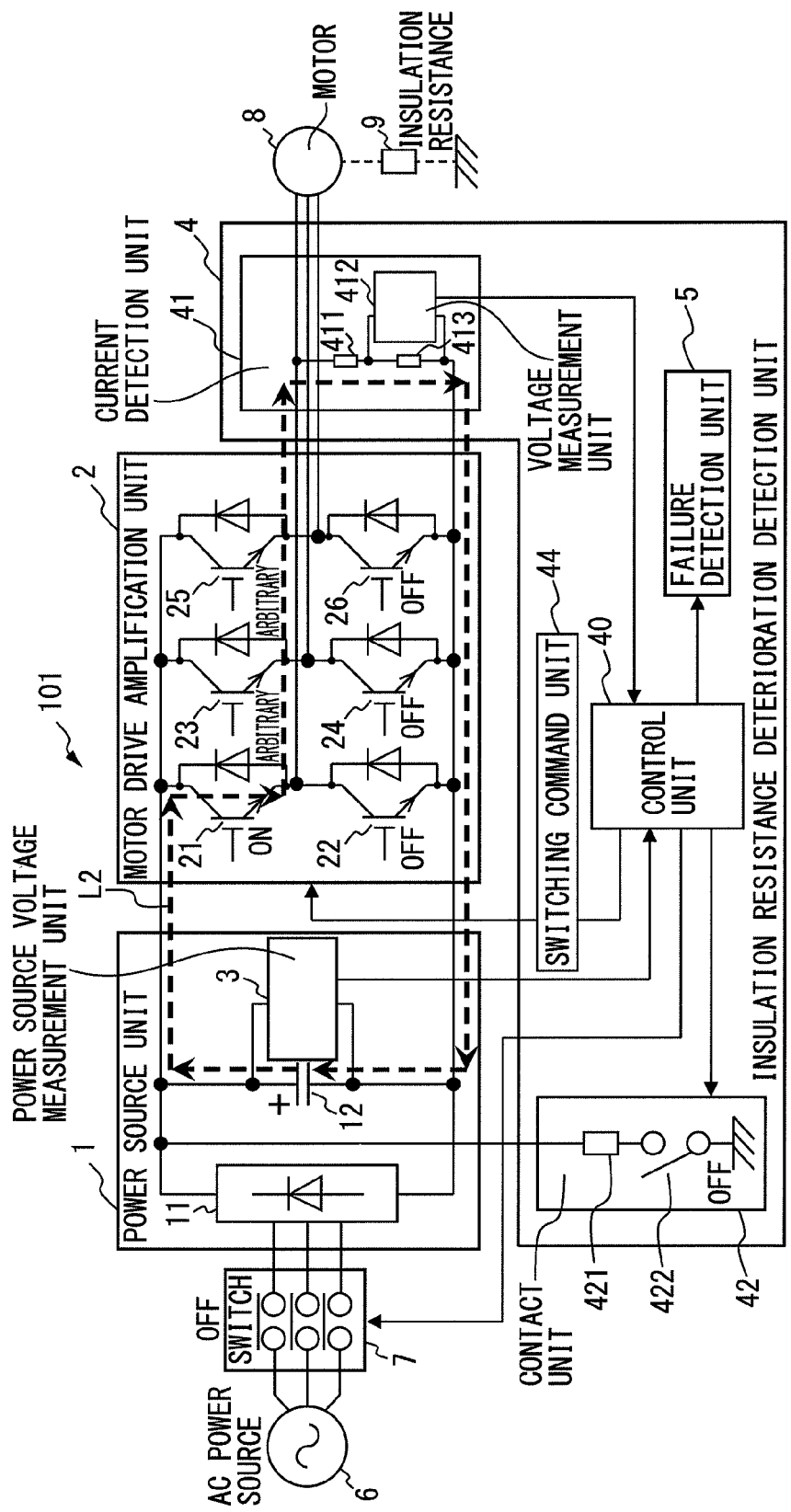
FIG. 3 is a diagram illustrating a path of a current that flows in the case where the presence/absence of a failure in an insulation resistance deterioration detection unit is determined in the motor drive device according to the first embodiment of the present invention.

Next, a method for detecting the presence/absence of a failure in the insulation resistance deterioration detection unit 4 in the motor drive device 101 according to the first embodiment of the present invention is explained. FIG. 3 is an example of the path of the current that flows in the case where the presence/absence of a failure in the insulation resistance deterioration detection unit is determined in the motor drive device according to the first embodiment of the present invention. First, in the motor drive device 101 according to the first embodiment of the present invention illustrated in FIG. 3, based on a command from the control unit 40, the contact unit 42 is changed from the on state to the off state, and based on a command from the switching command unit 44, switching of the upper-arm switching elements 21, 23, and 25 or the lower-arm switching elements 22, 24, and 26 of the motor drive amplification unit 2 is performed arbitrarily. For example, in the case where the U phase upper-arm switching element 21 is brought to the on state, and the lower-arm switching elements 22, 24, and 26 in the U phase, the V phase, and the W phase, respectively, are brought to the off state, the current flows through a path indicated by a dotted line L2 in FIG. 3.

Figure 4:
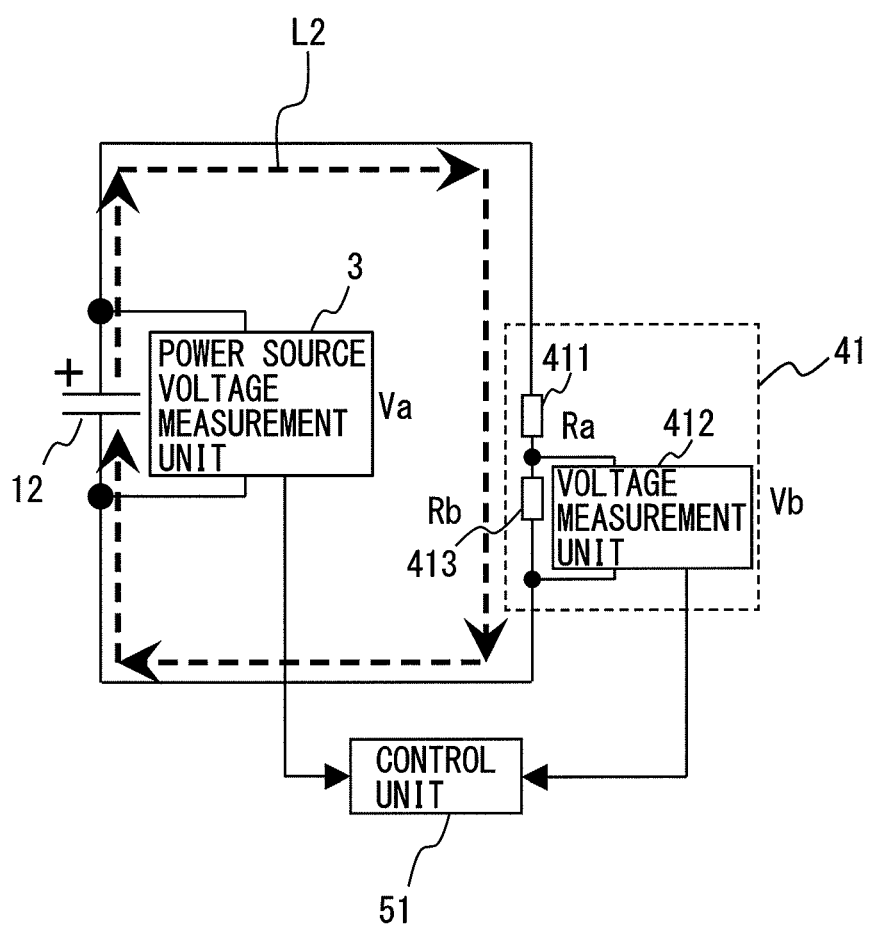
FIG. 4 is a diagram illustrating essential parts of the path of the current that flows in the case where the presence/absence of a failure in the insulation resistance deterioration detection unit is determined in the motor drive device according to the first embodiment of the present invention.

When the switching element is turned on, the short-circuited state is brought about, and therefore, if the circuit through which the current flows, which is indicated by the dotted line L2 in FIG. 3, is extracted and simplified, the circuit will be as illustrated in FIG. 4. In FIG. 4, the voltage detected by the power source voltage measurement unit 3, which is the voltage between the terminals of the smoothing capacitor 12, is defined as Va, the voltage detected by the voltage measurement unit 412, which is the voltage between the terminals of the detection resistance 413 of the current detection unit 41, as Vb, the voltage dividing resistance of the current detection unit 41 as Ra, and the detection resistance as Rb. Then, the relationship between these voltages and resistances is expressed by expression (1) below.

$$Va:Vb=(Ra+Rb):Rb \qquad (1)$$

As Va and Vb, actually measured values are used and as Ra and Rb, designed values are used. Here, if there is an abnormality in the measured values of the voltage Va and Vb, or in the resistance values Ra and Rb, the above-described expression (1) no longer holds. Consequently, it is possible to detect a failure in the insulation resistance deterioration detection unit 4 by determining whether or not the expression (1) holds.

Figure 5:
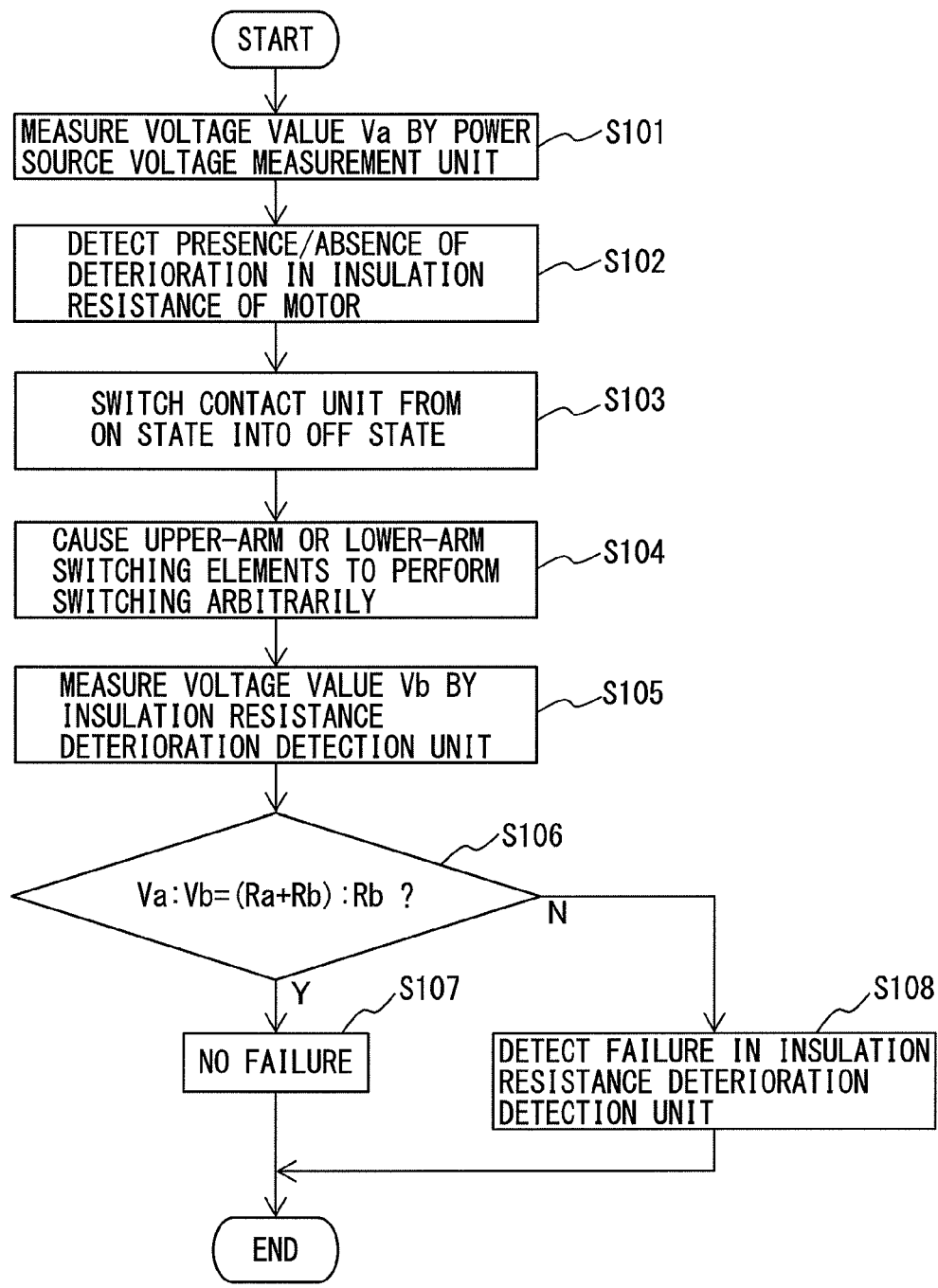
FIG. 5 is a flowchart for explaining a procedure to perform a failure detection method of the insulation resistance deterioration detection unit of the motor by using the motor drive device according to the first embodiment of the present invention.

Next, a method for detecting the presence/absence of a failure in the insulation resistance deterioration detection unit 4 of the motor by using the motor drive device 101 according to the first embodiment of the present invention is explained by using the flowchart in FIG. 5. First, at step S101, the power source voltage measurement unit 3 measures the voltage Va, which is the voltage between the terminals of the smoothing capacitor 12 of the power source unit 1.

Next, at step S102, the presence/absence of deterioration in the insulation resistance of the motor is detected. Specifically, after the insulation resistance deterioration detection unit 4 brings the switch 7 to the off state and stops the operation of the motor 8, the contact unit 42 at one end of the capacitor 12 is connected to the ground and, at the same time, the other end of the capacitor 12 is connected to the motor coil, and the current that flows through the closed circuit formed by the contact unit 42, the capacitor 12, the motor coil, and the ground is detected, and the presence/absence of a deterioration in the insulation resistance 9 of the motor is detected based on the detected current.

Next, at step S103, based on a command from the control unit 40, the contact unit 42 is changed from the on state to the off state.

Next, at step S104, switching of the upper-arm or lower-arm switching elements of the motor drive amplification unit 2 is performed arbitrarily.

Next, at step S105, the insulation resistance deterioration detection unit 4 measures the voltage value Vb, which is the detected signal.

Next, at step S106, the failure detection unit 5 determines whether the relationship Va:Vb=(Ra+Rb):Rb holds between the measured voltage value Vb, which is the detected signal of the current detection unit 41, and the voltage value Va measured in the power source unit 1.

In the case where the above-described expression holds, it is determined that a failure does not exist in the insulation resistance deterioration detection unit 4 at step S107. On the other hand, in the case where the above-described expression does not hold, it is determined that a failure has occurred in the insulation resistance deterioration detection unit 4 at step S108. In the manner as described above, it is possible to detect the presence/absence of a failure in the insulation resistance deterioration detection unit 4.

Figure 6:
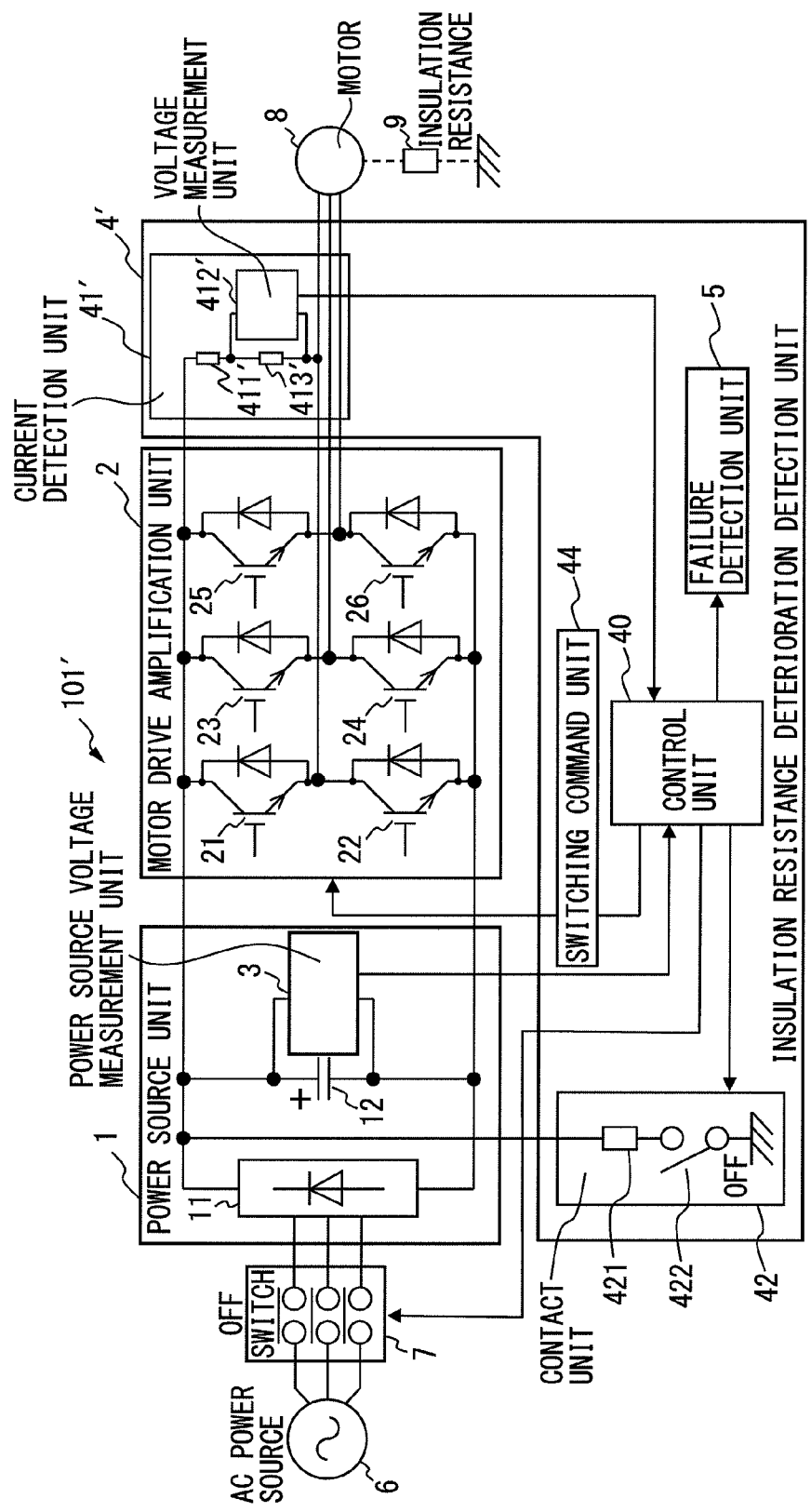
FIG. 6 is a block diagram of another configuration of the motor drive device according to the first embodiment of the present invention.

In the motor drive device 101 according to the first embodiment explained above, the example is illustrated in which the current detection unit 41 is arranged so as to detect the current that flows through the upper-arm switching elements of the motor drive amplification unit 2, but the configuration is not limited to that in the example. Another configuration, which is a modification example of the motor drive device of the first embodiment, is illustrated in FIG. 6. In a motor drive device 101' having another configuration illustrated in FIG. 6, it is possible for a current detection unit 41' to detect a current that flows through the lower-arm switching elements of the motor drive amplification unit 2. A voltage dividing resistance 411', a detection resistance 413', and a voltage measurement unit 412' of the current detection unit 41' illustrated in FIG. 6 correspond to the voltage dividing resistance 411, the detection resistance 413, and the voltage measurement unit 412 of the current detection unit 41 illustrated in FIG. 1, respectively. In the motor drive device, which is the modification example of the first embodiment, illustrated in FIG. 6, it is also possible to detect the presence/absence of a failure in the insulation resistance deterioration detection unit 4 as described above.

Second Embodiment

Figure 7:
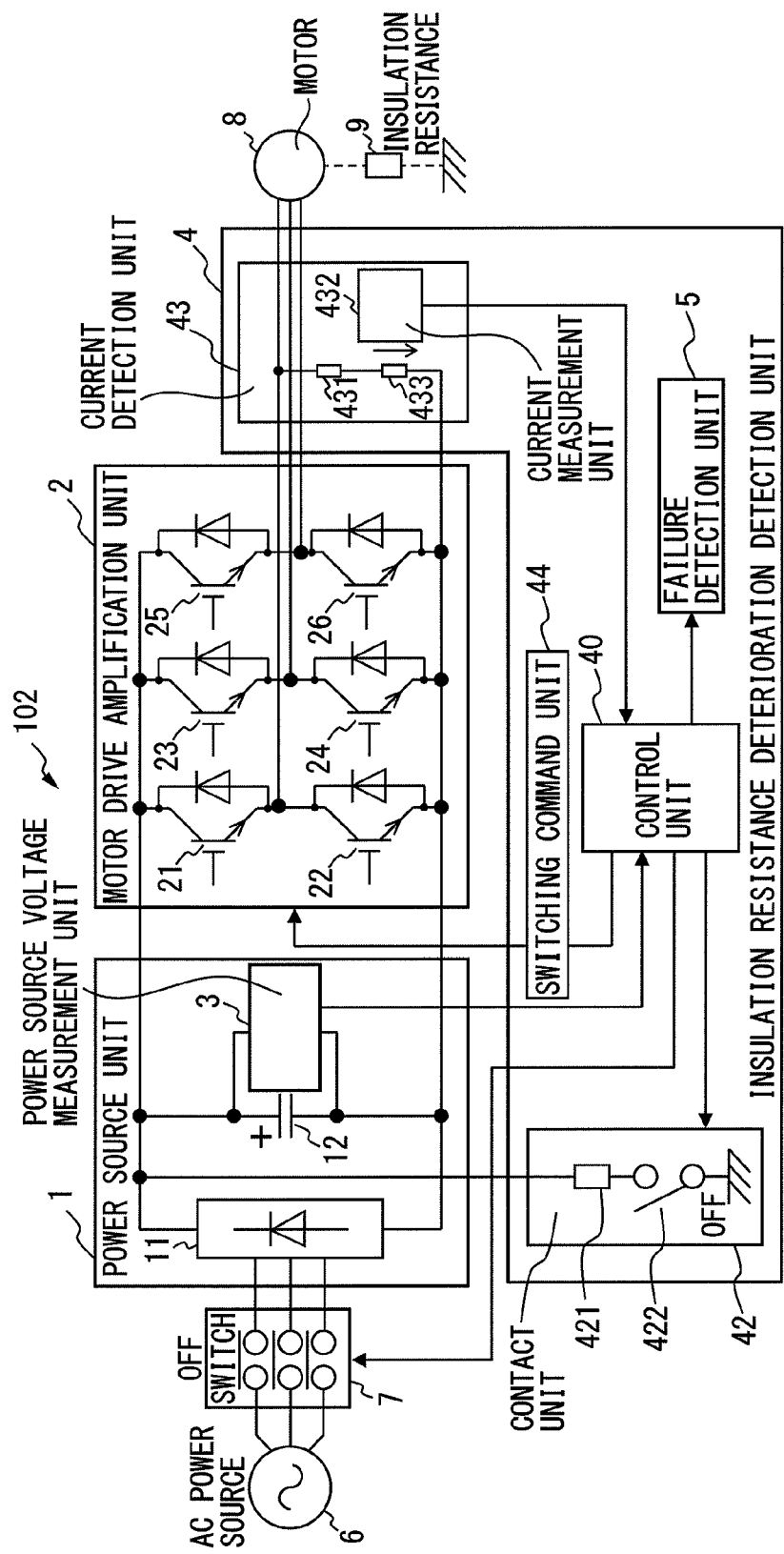
FIG. 7 is a block diagram of a motor drive device according to a second embodiment of the present invention.

Next, a motor drive device according to a second embodiment of the present invention is explained by using the drawings. A block diagram of a motor drive device 102 according to the second embodiment of the present invention is illustrated in FIG. 7. The motor drive device 102 according to the second embodiment differs from the motor drive device 101 according to the first embodiment in that the current detection unit 41 detects the current by measuring the voltage that is applied to the detection resistance 413 using the voltage measurement unit 412 in the first embodiment, but in the second embodiment, a current detection unit 43 measures the current that flows through a detection resistance 433 by using a current detector 432. In other words, the motor drive device 102 according to the second embodiment is characterized in that the insulation resistance deterioration detection unit 4 includes the current detector 432 configured to detect the current that flows through the motor coil, the detected signal is the current value detected by the current detector 432, and the presence/absence of a deterioration in the insulation resistance of the motor is detected by using the current value, which is the output value of the current detector 432. The other configurations in the motor drive device 102 of the second embodiment are the same as the configurations in the motor drive device 101 of the first embodiment, and therefore, detailed explanation is omitted.

Figure 8:
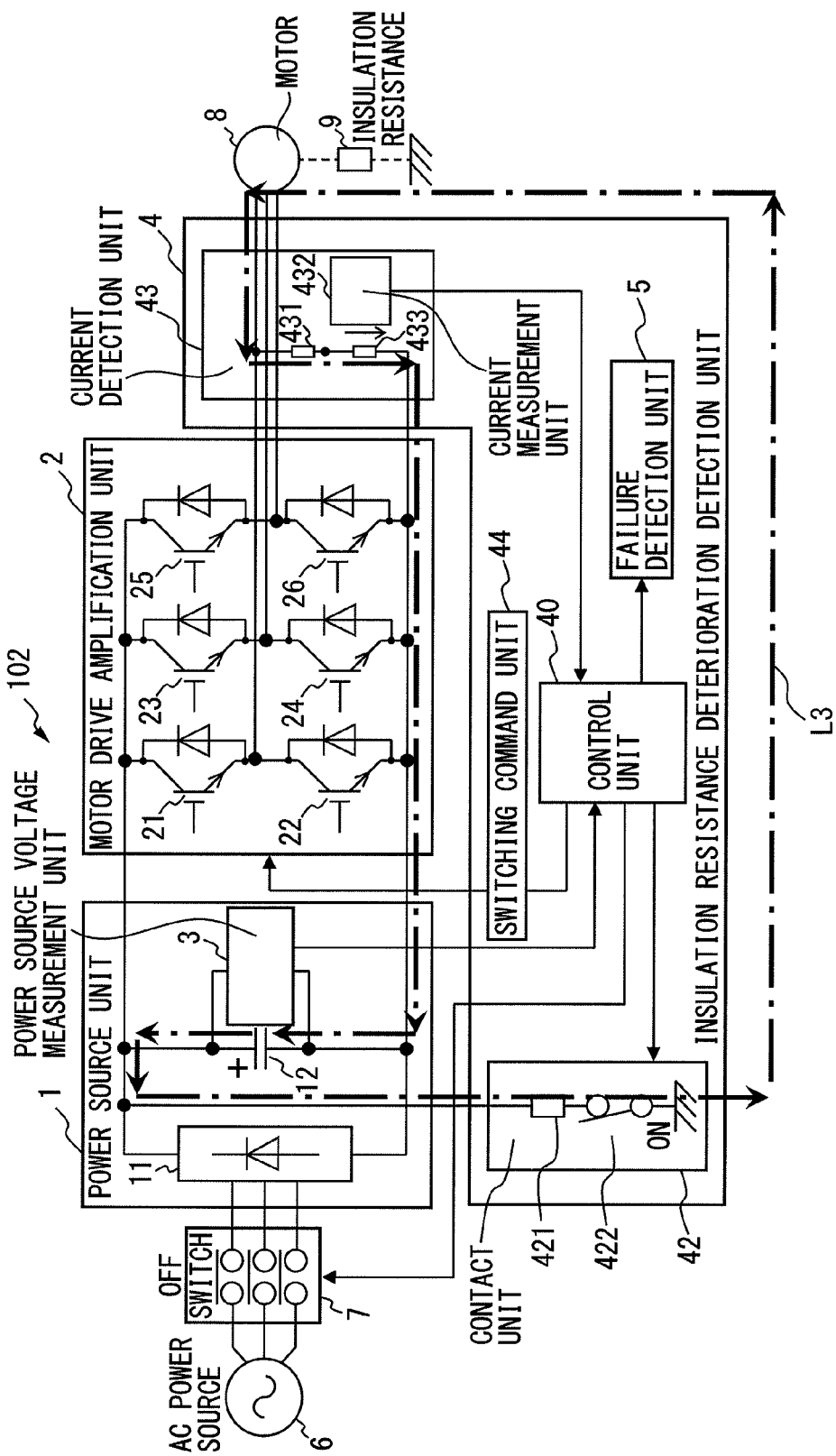
FIG. 8 is a diagram illustrating a path of a current that flows in the case where the insulation resistance of a motor is measured in the motor drive device according to the second embodiment of the present invention.

Next, a detection method of the insulation resistance of the motor using the motor drive device 102 according to the second embodiment of the present invention is explained. FIG. 8 illustrates a path of a current that flows in the case where the insulation resistance of the motor is measured in the motor drive device according to the second embodiment of the present invention. As illustrated in FIG. 8, based on a command from the control unit 40, the switch 7 is brought to the off state, the switch 422 of the contact unit 42 is brought to the on state, and the switching elements 21 to 26 of the motor amplification unit 2 are brought to the off state. At this time, through the closed circuit formed by the contact unit 42, the smoothing capacitor 12, the motor coil, and the ground, the current flows through a path illustrated by a chain line L3. By the current detector 43 measuring the current, it is possible to detect the insulation resistance of the motor. Specifically, by dividing the voltage of the power source unit 1, which is obtained by rectifying the AC voltage from the AC power source 6, by the measured current, it is possible to find the resistance value of the entire path through which the current flows. By subtracting the resistance value within the circuit that is used in the design from the obtained resistance value, it is possible to calculate the insulation resistance. However, if a failure (abnormality in the resistance value within the circuit or in the measured value of the voltage) occurs in the insulation resistance deterioration detection unit (within the route indicated by the arrow-attached chain line L3), the calculated value of the insulation resistance value also becomes abnormal, and it is no longer possible to calculate an accurate value of the insulation resistance. Because of this, the motor drive device 102 according to the second embodiment of the present invention includes the failure detection unit 5 configured to detect the presence/absence of a failure in the insulation resistance deterioration detection unit 4.

Figure 9:
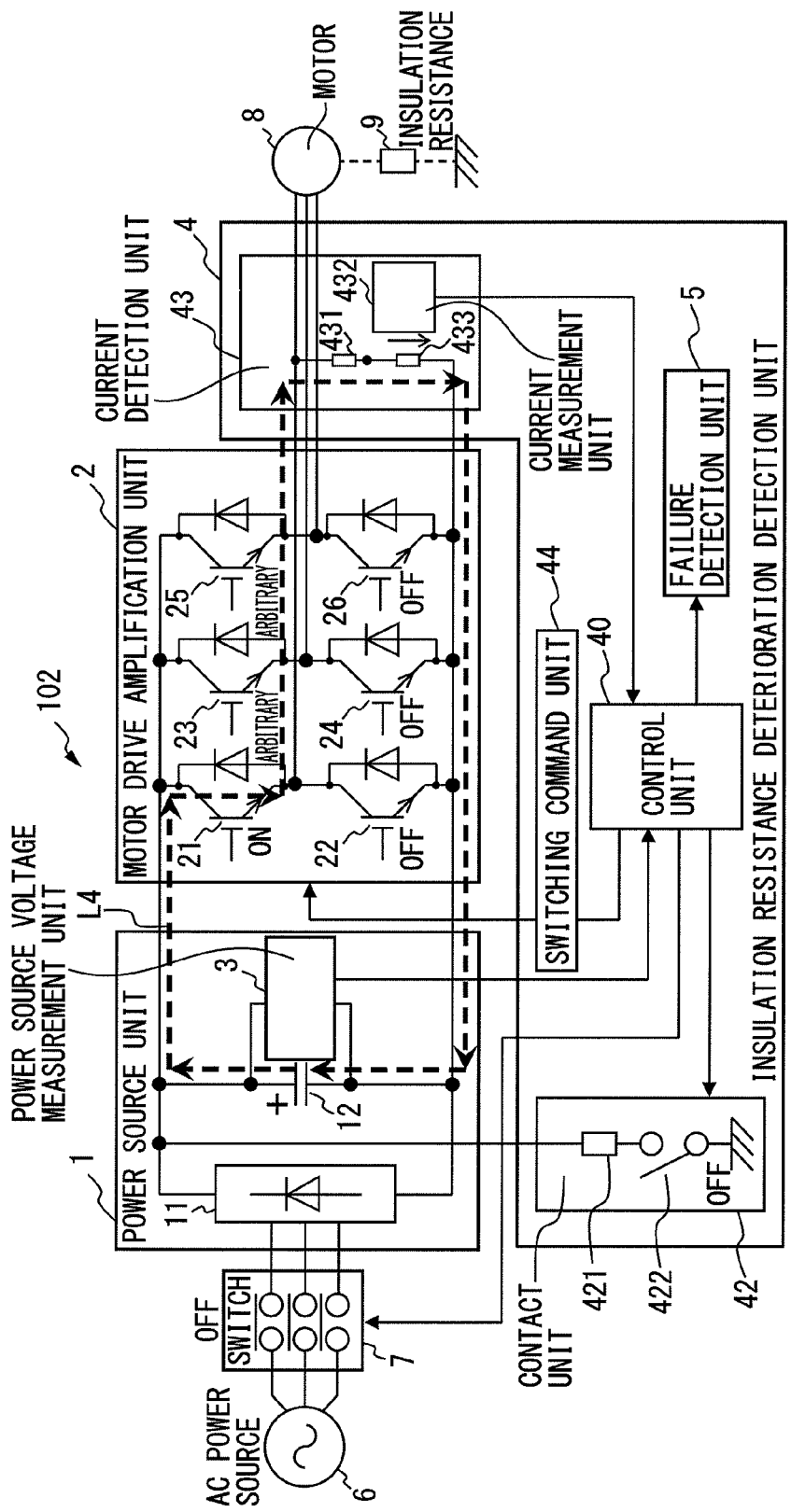
FIG. 9 is a diagram illustrating a path of a current that flows in the case where the presence/absence of a failure in an insulation resistance deterioration detection unit is determined in the motor drive device according to the second embodiment of the present invention.

Next, a method for detecting the presence/absence of a failure in the insulation resistance deterioration detection unit 4 in the motor drive device 102 according to the second embodiment of the present invention is explained. FIG. 9 illustrates an example of a path of a current that flows in the case where the presence/absence of a failure in the insulation resistance deterioration detection unit is determined in the motor drive device according to the second embodiment of the present invention. First, in the motor drive device 102 according to the second embodiment of the present invention illustrated in FIG. 9, based on a command from the control unit 40, the contact unit 42 is changed from the on state to the off state and based on a command from a switching command unit 44, switching of the upper-arm switching elements 21, 23, and 25 or the lower-arm switching elements 22, 24, and 26 of the motor drive amplification unit 2 is performed arbitrarily. For example, in the case where the U-phase upper-arm switching element 21 is brought to the on state and the U-phase, V-phase, and W-phase lower-arm switching elements 22, 24, and 26 are brought to the off state, the current flows through a path indicated by a dotted line L4 in FIG. 9.

Figure 10:
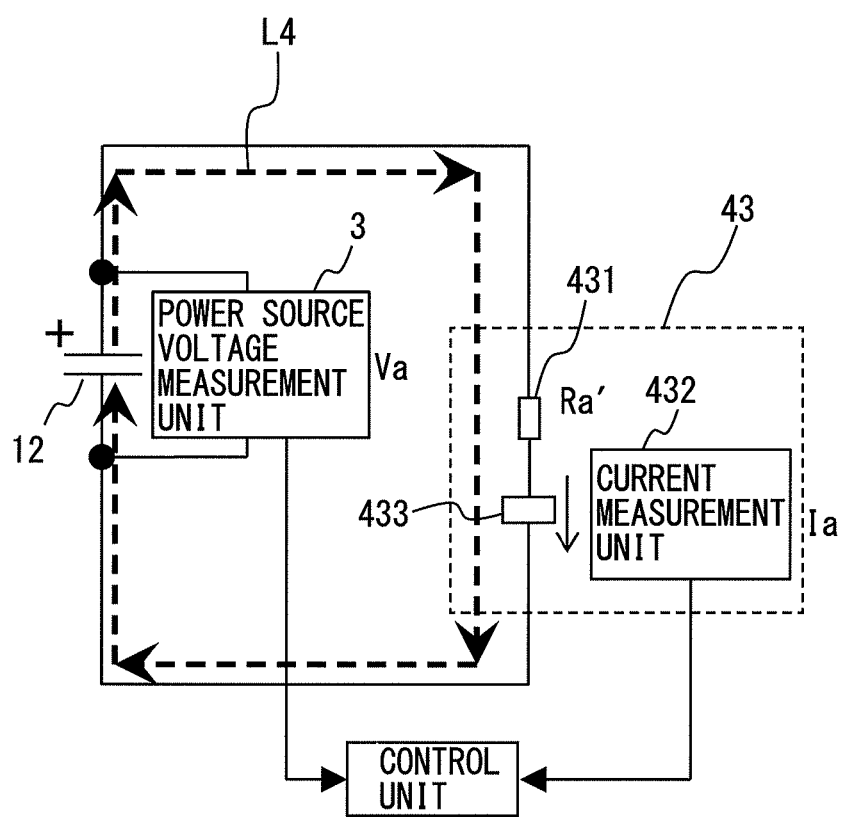
FIG. 10 is a diagram illustrating essential parts of the path of the current that flows in the case where the presence/absence of a failure in the insulation resistance deterioration detection unit is determined in the motor drive device according to the second embodiment of the present invention.

When the switching element is turned on, the short-circuited state is brought about, and therefore, if the circuit through which the current flows, which is indicated by the dotted line L4 in FIG. 9, is extracted and simplified, the circuit will be as illustrated in FIG. 10. In FIG. 10, the voltage detected by the power source voltage measurement unit 3, which is the voltage between the terminals of the smoothing capacitor 12, is defined as Va, the total value of a resistance 431 and the resistance 433 of the current detection unit 43 as Ra', and the detected current, which is the detected signal of the current detector 432, as Ia. Then, the relationship between the voltage, resistance, and current is expressed by expression (2) below.

$$Va = Ia \times Ra' \qquad (2)$$

As Va and Ia, actually measured values are used. As Ra', a designed value is used. Here, if there is an abnormality in the measured value of the voltage Va or the current Ia, or in the resistance value Ra', the above-described expression (2) no longer holds. Consequently, it is possible to detect a failure in the insulation resistance deterioration detection unit by determining whether the expression (2) holds.

Figure 11:
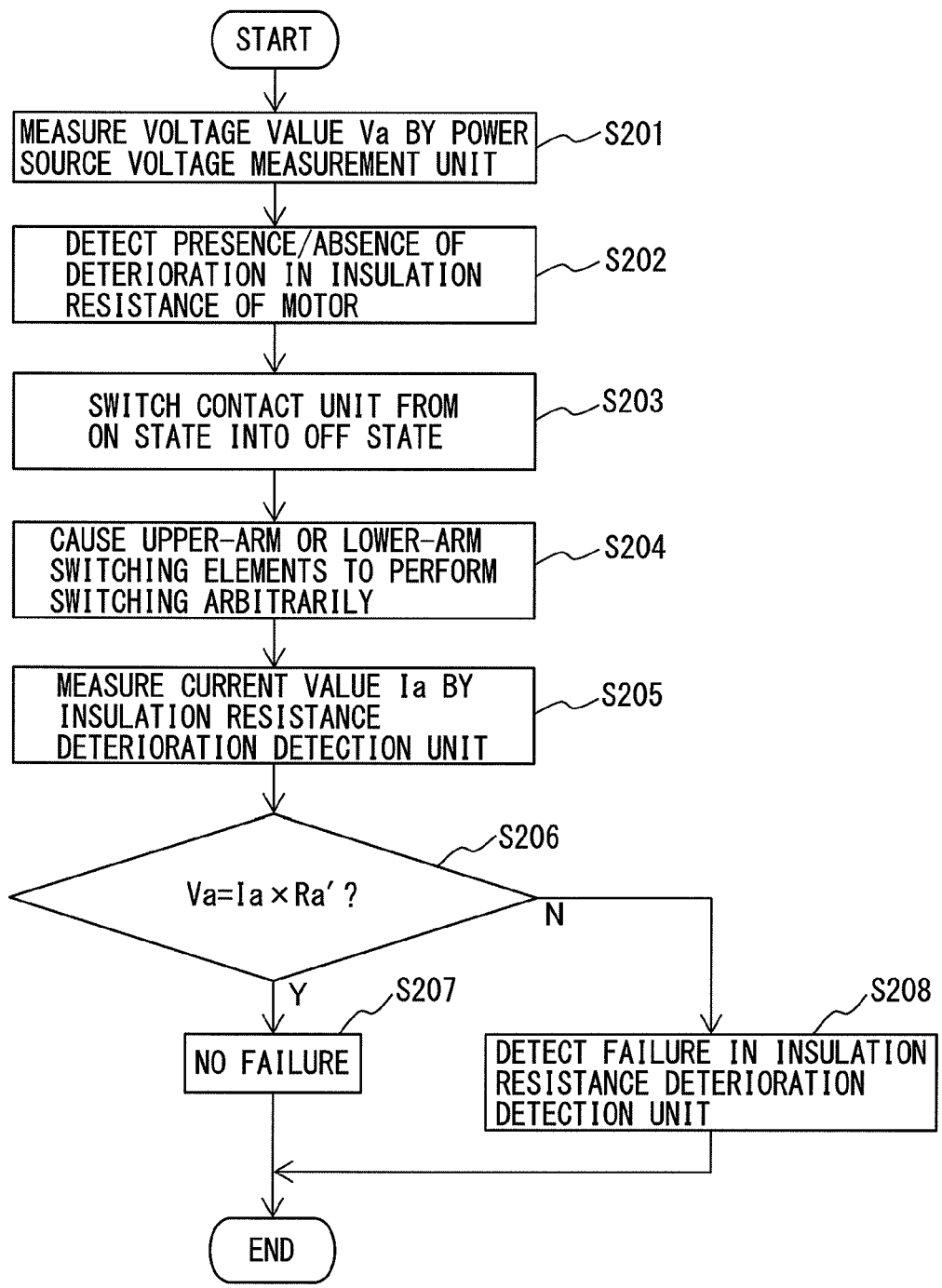
FIG. 11 is a flowchart for explaining a procedure to perform a failure detection method of the insulation resistance deterioration detection unit of the motor by using the motor drive device according to the second embodiment of the present invention.

Next, a method for detecting a failure in the insulation resistance deterioration detection unit 4 of the motor by using the motor drive device 102 according to the second embodiment of the present invention is explained by using the flowchart in FIG. 11. First, at step S201, the power source voltage measurement unit 3 measures the voltage Va, which is the voltage between the terminals of the smoothing capacitor 12 of the power source unit 1.

Next, at step S202, the presence/absence of a deterioration in the insulation resistance 9 of the motor is detected. Specifically, after the insulation resistance deterioration detection unit 4 brings the switch 7 to the off state and stops the operation of the motor 8, the contact unit 42 at one end of the capacitor 12 is connected to the ground and, at the same time, the other end of the capacitor 12 is connected to the motor coil, and the current that flows through the closed circuit formed by the contact unit 42, the capacitor 12, the motor coil, and the ground is detected, and the presence/absence of a deterioration in the insulation resistance 9 of the motor is detected based on the detected current.

Next, at step S203, based on a command from the control unit 40, the contact unit 42 is changed from the on state to the off state.

Next, at step S204, switching of the upper-arm or lower-arm switching elements of the motor drive amplification unit 2 is performed arbitrarily.

Next, at step S205, the current value Ia is measured in the insulation resistance deterioration detection unit 4.

Next, at step S206, the failure detection unit 5 determines whether Va=Ia×Ra' holds between the measured current value Ia and the voltage value Va measured by the power source voltage measurement unit 3.

In the case where the above-described expression holds, it is determined that a failure does not exist in the insulation resistance deterioration detection unit 4 at step S207. On the other hand, in the case where the above-described expression does not hold, it is determined that a failure has occurred in the insulation resistance deterioration detection unit 4 at step S208. In the manner as described above, it is possible to detect the presence/absence of a failure in the insulation resistance deterioration detection unit 4.

Figure 12:
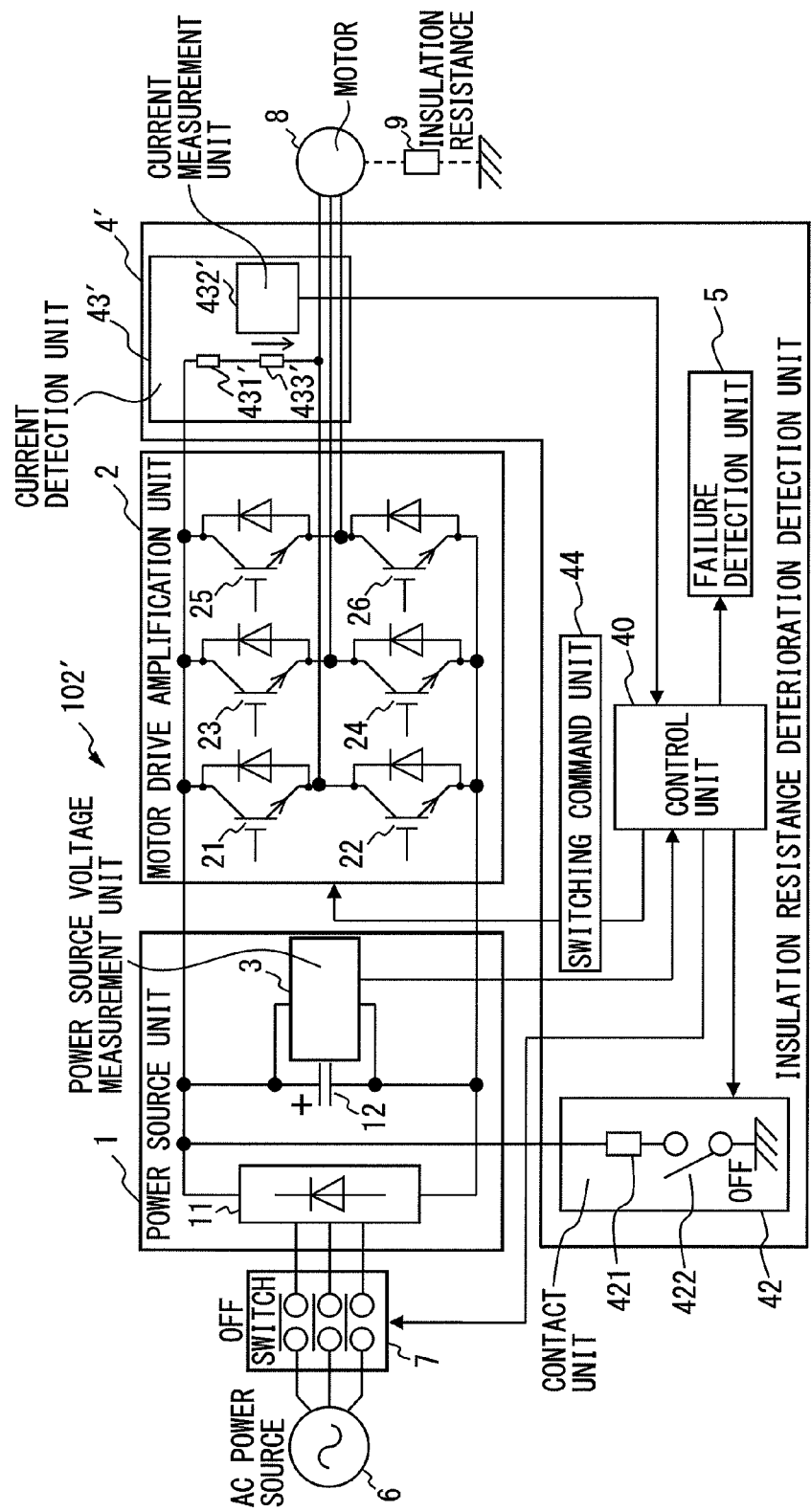
FIG. 12 is a block diagram of another configuration of the motor drive device according to the second embodiment of the present invention.

In the motor drive device 102 according to the second embodiment described above, the example is illustrated in which the current detection unit 43 is arranged so as to detect the current that flows through the upper-arm switching elements of the motor drive amplification unit 2, but the configuration is not limited to this example. Another configuration, which is a modification example of the motor drive device of the second embodiment, is illustrated in FIG. 12. In a motor control device 102' having another configuration of the second embodiment illustrated in FIG. 12, it is possible for a current detection unit 43' to detect the current that flows through the lower-arm switching elements of the motor drive amplification unit 2. Resistances 431' and 433' and a current detector 432' of the current detection unit 43' illustrated in FIG. 12 correspond to the resistances 431 and 433 and the current detector 432 of the current detection unit 43 illustrated in FIG. 7, respectively. In the motor drive device 102', which is a modification example of the second embodiment illustrated in FIG. 12, it is also possible to detect the presence/absence of a failure in the insulation resistance deterioration detection unit 4 as described above.

According to the present invention, it is possible to provide a motor drive device that detects a failure in the insulation resistance deterioration detection unit of a motor without adding a dedicated detection circuit and without increasing any unnecessary costs.

The invention claimed is:

1. A motor drive device having a function to detect a failure in an insulation resistance deterioration detection unit of a motor, the motor drive device comprising:
    a power source unit configured to rectify an AC voltage supplied from an AC power source via a switch to a DC voltage in a rectification circuit and to smooth the rectified DC voltage by a capacitor;
    a motor drive amplification unit configured to drive a motor by converting the DC voltage from the power source unit to an AC voltage by using upper-arm and lower-arm switching elements;
    a power source voltage measurement unit configured to measure the voltage of the power source unit;
    an insulation resistance deterioration detection unit having a contact unit configured to connect one end of the capacitor to the ground and a current detection unit provided between the other end of the capacitor and a motor coil, and configured to detect the presence/absence of a deterioration in an insulation resistance of the motor based on a detected signal that is obtained from a closed circuit formed by the contact unit, the capacitor, the motor coil, and the ground by using the current detection unit after bringing the switch to the off state and the contact unit to the on state; and
    a failure detection unit configured to detect the presence/absence of a failure in the insulation resistance deterioration detection unit based on the detected signal in the insulation resistance deterioration detection unit and a voltage value measured by the power source voltage measurement unit by changing the contact unit from the on state to the off state and causing the upper-arm or lower-arm switching elements of the motor drive amplification unit to perform switching arbitrarily.

2. The motor drive device according to claim 1, wherein the insulation resistance deterioration detection unit is provided with a resistance in the closed circuit,
    the detected signal is a difference between potentials that occur on both ends of the resistance, and
    the insulation resistance deterioration detection unit detects the presence/absence of a deterioration in the insulation resistance of the motor by detecting a current from the potential difference and the resistance.

3. The motor drive device according to claim 1, wherein the insulation resistance deterioration detection unit includes a current detector configured to detect a current that flows through the motor coil,
    the detected signal is a current value detected by the current detector, and the insulation resistance deterioration detection unit detects the presence/absence of a deterioration in the insulation resistance of the motor by using the current value, which is an output value of the current detector.

4. A failure detection method of an insulation resistance deterioration detection unit of a motor in a motor drive device including a power source unit configured to rectify power supplied from an AC power source via a switch in a rectification circuit and to smooth the power by a capacitor, and a motor drive amplification unit configured to drive a motor by converting the DC voltage from the power source unit to an AC voltage, the failure detection method comprising the steps of:

measuring a voltage of the power source unit;

detecting, by the insulation resistance deterioration detection unit, the presence/absence of a deterioration in an insulation resistance of the motor based on a detected signal that is obtained from a closed circuit formed by a contact unit, the capacitor, a motor coil, and the ground by connecting the contact unit connected to one end of the capacitor to the ground and, at the same time, connecting the other end of the capacitor to the motor coil after bringing the switch to the off state and stopping the operation of the motor;

changing the contact unit from the on state to the off state;

causing upper-arm or lower-arm switching elements of the motor drive amplification unit to perform switching arbitrarily; and detecting a failure in the insulation resistance deterioration detection unit based on the detected signal measured in the step for detecting the presence/absence of the deterioration in the insulation resistance and a voltage value measured by the power source unit.

5. The failure detection method according to claim 4, wherein a resistance is provided in the closed circuit, the detected signal is a difference between potentials that occur on both ends of the resistance, and the step for detecting the presence/absence of the deterioration in the insulation resistance includes a step of detecting an insulation resistance deterioration of the motor by detecting a current from the potential difference and the resistance.

6. The failure detection method according to claim 4, wherein the detected signal is a current value detected by a current detector configured to detect a current that flows through a motor coil, and the step for detecting the presence/absence of the deterioration in the insulation resistance includes a step of detecting an insulation resistance deterioration of the motor by using a current value, which is an output value of the current detector.

* * * * *